United States Patent [19]

Shinohara

[11] Patent Number: 5,075,737
[45] Date of Patent: Dec. 24, 1991

[54] THIN FILM SEMICONDUCTOR DEVICE

[75] Inventor: Toshiro Shinohara, Yokosuka, Japan

[73] Assignee: Nissan Motor Co., Ltd., Yokohama, Japan

[21] Appl. No.: 596,750

[22] Filed: Oct. 10, 1990

Related U.S. Application Data

[63] Continuation of Ser. No. 202,293, Jun. 6, 1988, abandoned.

[30] Foreign Application Priority Data

Jun. 16, 1987 [JP] Japan .................. 62-148043

[51] Int. Cl.$^5$ ............................. H01L 27/12
[52] U.S. Cl. .......................... 357/4; 357/34; 357/35
[58] Field of Search ............... 357/4, 35, 34, 56, 59

[56] References Cited

U.S. PATENT DOCUMENTS

| 3,660,732 | 2/1972 | Allison | 357/35 |
| 3,943,555 | 3/1976 | Mueller et al. | 357/35 |
| 4,050,965 | 9/1977 | Ipri et al. | 357/35 |
| 4,127,860 | 11/1978 | Beelitz et al. | 357/4 |
| 4,419,685 | 12/1983 | Sugawara et al. | 357/35 |
| 4,532,003 | 6/1985 | Beasom | 357/34 |
| 4,538,167 | 8/1985 | Yoshino et al. | 357/59 |
| 4,546,536 | 10/1985 | Anantha et al. | 357/35 |
| 4,897,698 | 1/1990 | Zorinsky | 357/35 |

FOREIGN PATENT DOCUMENTS 0138563 4/1985 European Pat. Off. ............. 357/35

OTHER PUBLICATIONS

Solomon et al., "A Polysilicon Base Bipolar Transistor," International Electron Devices Meeting Technical Digest, 1979, pp. 510–513.
Chang et al., "Amorphous Silicon Bipolar Transistor with High Gain (>12) and High Speed (>30 µs)," International Electron Devices Meeting Technical Digest, 5/1985, pp. 432–435.

Primary Examiner—Andrew J. James
Assistant Examiner—Courtney A. Bowers
Attorney, Agent, or Firm—Foley & Lardner

[57] ABSTRACT

A thin film semiconductor device has an n-type collector region formed in a semiconductor thin film on an insulating substrate, a p-type base region formed in the collector region, and an n-type emitter region. The base and emitter regions are formed by successive diffusion steps of p-type impurities and n-type impurities by using the same mask through the same diffusion window in such a manner than the base width is determined by a difference between the lateral diffusion distance of the p-type impurities and the lateral diffusion distance of the n-type impurities from the common diffusion window.

22 Claims, 5 Drawing Sheets

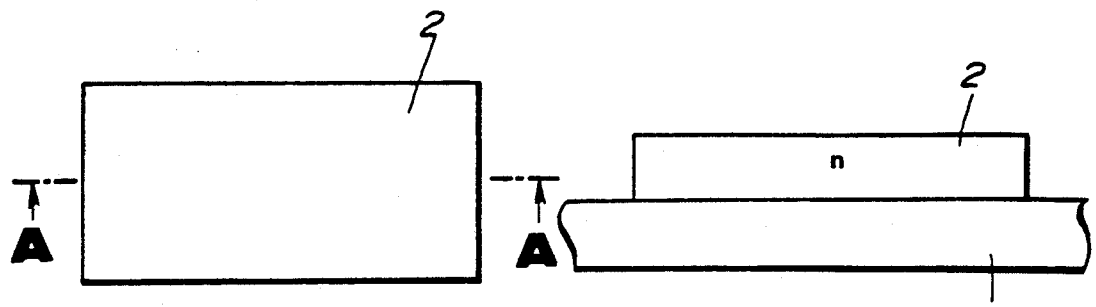
FIG. 3A(T)  FIG. 3A(S)
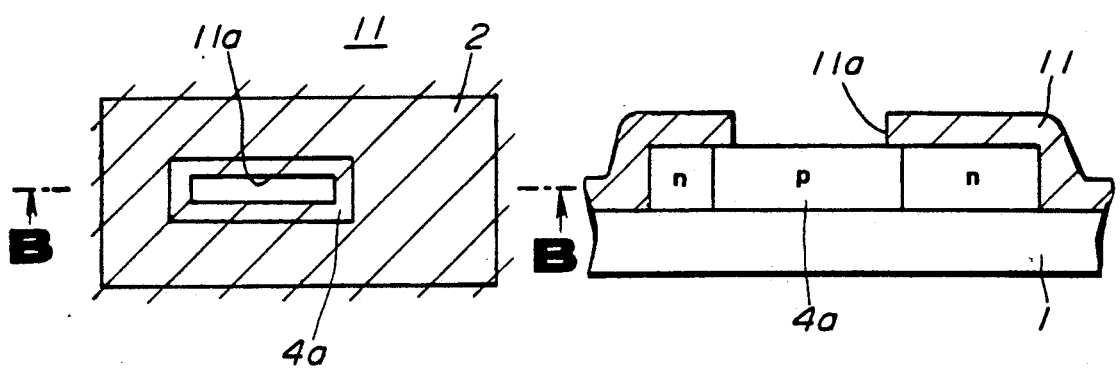
FIG. 3B(T)  FIG. 3B(S)
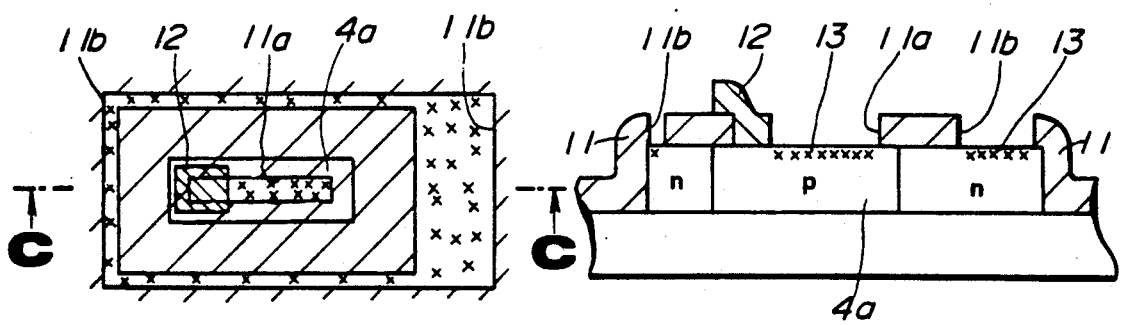
FIG. 3C(T)  FIG. 3C(S)

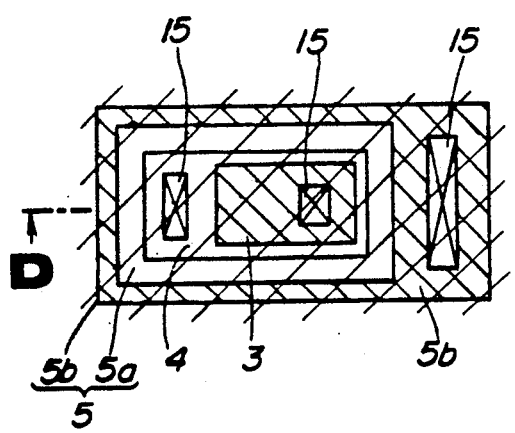
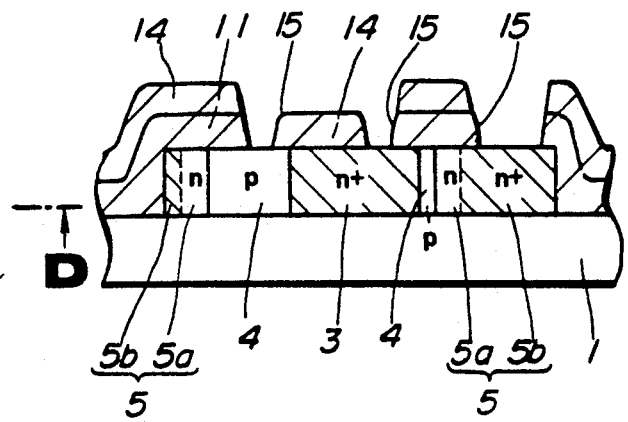
FIG. 3D(T)  FIG. 3D(S)
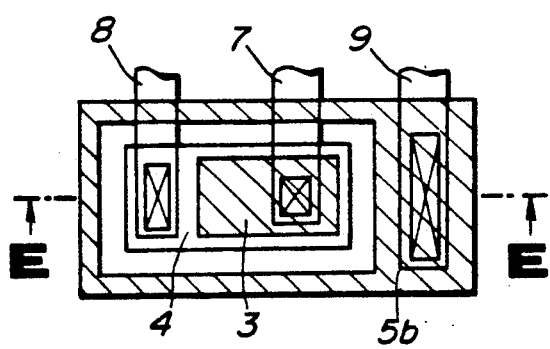
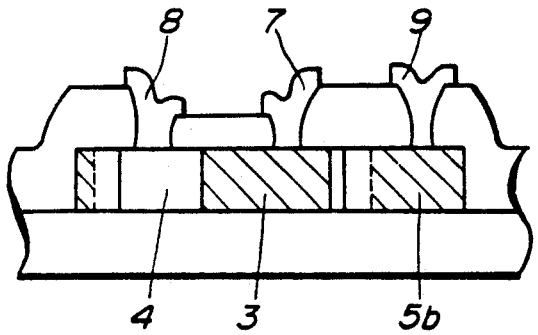
FIG. 3E(T)  FIG. 3E(S)

THIN FILM SEMICONDUCTOR DEVICE

This application is a continuation of application Ser. No. 07/202,293, filed June 6, 1988 now abandoned.

BACKGROUND OF THE INVENTION

The present invention relates to a bipolar type thin film semiconductor device using the SOI (Semiconductor on Insulator) technique.

FIG. 4 shows one conventional example (1979 International Electron Devices Meeting, Technical Digest, pp., 510-513), and FIG. 6 shows another conventional example (1985 International Electron Devices Meeting, Technical Digest, pp., 432-435).

The first conventional thin film device shown in FIG. 4 includes a p+ silicon substrate 21 serving as an emitter region, an n+ polycrystalline silicon film 22 serving as a base region, and a p-type polycrystalline silicon film 23 serving as a collector region. The base region 22 is highly doped that its impurity concentration is equal to or higher than about $10^{21}$ cm$^{-3}$. The device of FIG. 4 further includes a silicon oxide film 24, an emitter electrode 25, a base electrode 26, and a collector electrode 27. In this way, the first conventional device is in the form of a laminate type pnp bipolar transistor.

FIG. 5 shows characteristics of emitter current Ie and collector current Ic versus the base width in the laminated bopolar transistor of FIG. 4. As is well known in the art, the base width is the minimum spacing between the collector and emitter regions which are separated from each other by the base region. In this transistor, the base width is the thickness of the n+ polycrystalline silicon film 22. As shown in FIG. 5, the emitter current Ie and collector current Ic of the laminated bipolar transistor vary in dependence on the film thickness of the n+ poly-crystalline silicon film. Especially, the collector current Ic is varied steeply at a high rate of change with respect to the base width.

In general, the emitter current Ie of a bipolar transistor is expressed by;

$$Ie = Ib + Ic \quad (1)$$

where Ib is a base current. Grounded emitter current amplification factor $\beta$ and grounded base current amplification factor $\alpha$ are expressed as follows;

$$\beta = Ic/Ib \quad (2)$$

$$\alpha = \beta/(1+\beta) = Ic/Ie \quad (3)$$

From the equation (3), the condition which must be satisfied in order to make the grounded emitter current amplification factor $\beta$ of the laminated bipolar transistor of FIG. 4 equal to about five ($\beta=5$), is obtained as follows;

$$\alpha = 5/(1+5) = 5/6 = Ic/Ie \quad (4)$$

Therefore, in order to satisfy this condition that Ic/Ie=5/6 with the characteristics of FIG. 5, it is necessary to make the base width, that is, the thickness of the n+ polycrystalline silicon film, equal to or smaller than several hundred angstroms. Even though the impurity concentration of the base region 22 is made higher than the level of $10^{21}$ cm$^{-3}$, the base width must be made lower than several thousand angstroms in order to increase the grounded emitter current amplification factor $\beta$ to a sufficient level.

However, the fabrication process required for accurately controlling the thickness of the n+ polycrystalline silicon film 22 at the level of several hundreds or several thousand angstroms is complicated and causative of an increase in the fabrication cost of the device.

The second conventional thin film semiconductor device shown in FIG. 6 includes a glass substrate 31, a transparent electrode 32 consisting of an ITO (an alloy of indium oxide and tin oxide) film, formed on the glass substrate 31, and a laminate 30 of amorphous silicon. The amorphous silicon laminate 30 includes an n-type collector region 33 consisting of an n+ highly doped layer 33a and an n-type lightly doped layer 33b, a first i layer (intrinsic layer) 34, a p-type base region 35, a second i layer (intrinsic layer) 36, and an n+ emitter region 37. A top layer 38 is an emitter electrode of an Al film, and an electrode 39 is an collector electrode. Thus, the second conventional device is an npn bipolar transistor having a laminated structure.

FIG. 7 shows a relationship between the grounded emitter current amplification factor $\beta$ of the bipolar transistor of FIG. 6 and a thickness t of the first i layer 34 formed between the base and collector regions. As shown in FIG. 7, the grounded emitter current amplification factor $\beta$ of the second conventional device is strongly dependent on the thickness t of the first i layer 34. For example, the thickness t of the first i layer 34 must be controlled below about 5000 angstroms in order to make $\beta$ equal to about 5 ($\beta=5$).

In this case, too, the fabrication process required for accurately controlling the thickness t of a the first i layer 34 below the above-mentioned value is complicated and causative of cost increase. Furthermore, the difference in height between the laminate structure 30 and the remaining top surface of the substrate of the device of FIG. 6 is so increased that it is difficult to integrate this thin film bipolar transistor with other bulk semiconductor components formed in a silicon semiconductor substrate into the form of a compact IC.

SUMMARY OF THE INVENTION

It is an object of the present invention to provide a thin film semiconductor device which is high in performance, low in fabricating cost and suitable for integration with bulk semiconductor devices into an IC; and to provide a method for fabricating such a thin film semiconductor device According to the present invention, a thin film semiconductor device comprises a collector region of a first conductivity type such as the n-type, a base region of a second conductivity type such as the p-type, and an emitter region of the first conductivity type. The collector region is formed in a semiconductor thin film which is formed on an insulating substrate. The base region is formed in the collector region by introducing second type impurities only through a predetermined surface area of the thin film. The emitter region is formed in the thin film by introducing first type impurities only through the predetermined surface area in such a manner that a base width of the base region is determined by a difference between a distance of diffusion (such as lateral diffusion) of the second type impurities from the predetermined surface area and a distance of diffusion (such as lateral diffusion) of the first type impurities from the predetermined surface area.

BRIEF DESCRIPTION OF THE DRAWINGS

FIGS. 3A(T)–3E(S) are views for showing one process for fabricating the device of FIG. 1, FIGS. 3A(T),3B(T), . . . 3E(T) are top views, and FIGS. 3A(S),3B(S), . . . 3E(S) are sectional views taken across, respectively, lines A—A, B—B, C—C, D—D and E—E of the top views.

DETAILED DESCRIPTION OF THE INVENTION

Figure 1:
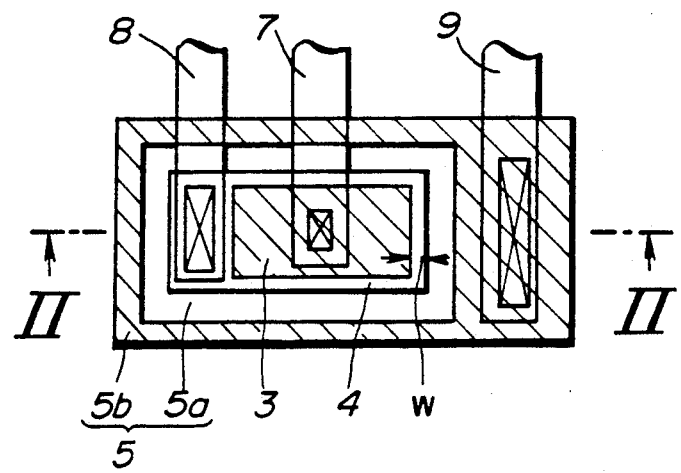
FIG. 1 is a plan view of a thin film semiconductor device according to one embodiment of the present invention.
Figure 2:
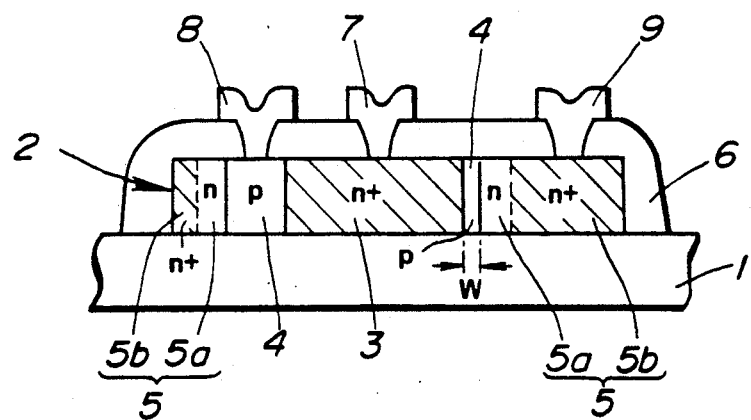
FIG. 2 is a sectional view taken across a line II—II of FIG. 1.
Figure 4:
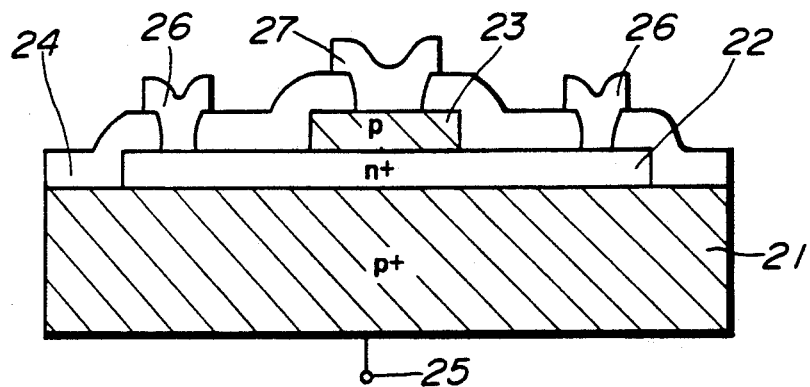
FIG. 4 is a vertical section of a first conventional thin film semiconductor device.
Figure 5:
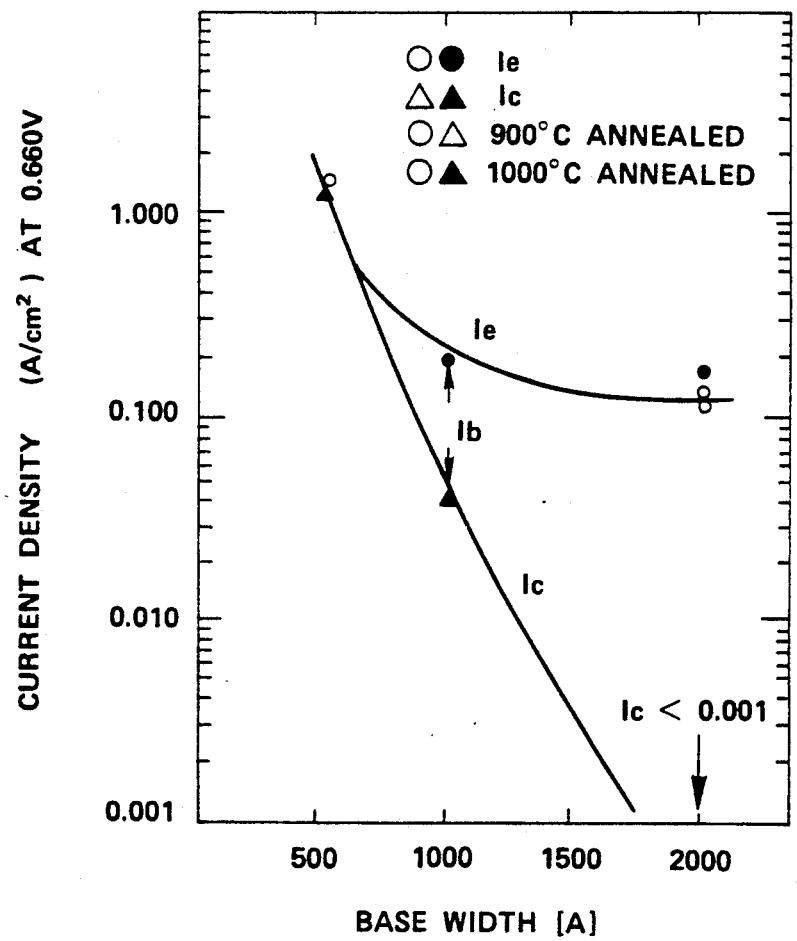
FIG. 5 is a graph showing variations of collector current and emitter current of the conventional device of FIG. 4 in dependence on the base width.
Figure 6:
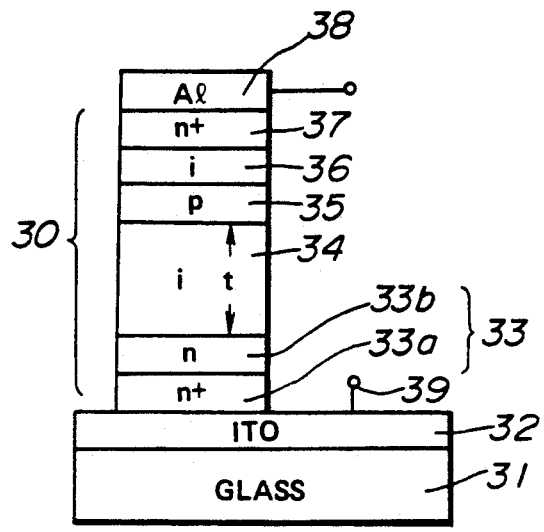
FIG. 6 is a vertical section of a second conventional device.
Figure 7:
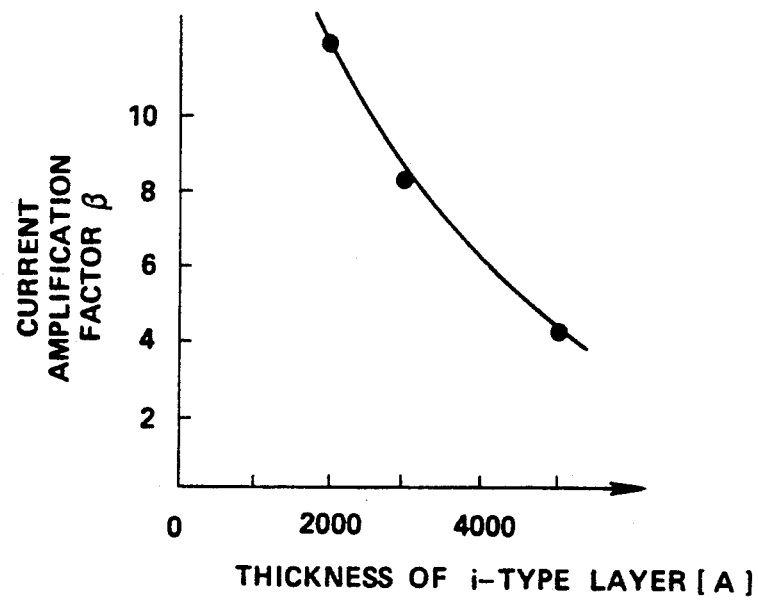
FIG. 7 is a graph showing a relationship between the thickness of an i layer of the conventional device of FIG. 6 and the current gain.

One embodiment of the present invention is shown in FIGS. 1, 2 and 3A(T)–3E(S). In this embodiment, the invention is applied to an npn bipolar transistor.

A thin film semiconductor device shown in FIGS. 1 and 2 includes an insulating substrate 1 and a semiconductor thin film 2 formed on the insulating substrate 1. The semiconductor thin film 2 has a bottom surface contiguous to the insulating substrate 1, and a top surface remote from the insulating substrate 1. The insulating substrate 1 may be a substrate entirely made of an appropriate insulating material or may be a substrate of a semiconductor such as silicon, covered by an insulating film such as a silicon oxide film. The semiconductor thin film 2 of this embodiment is a polycrystalline silicon film which is deposited to a predetermined thickness on the insulating substrate 1 by LP(low pressure)CVD, and patterned into a predetermined shape.

In the polycrystalline silicon film 2, there are formed n+ emitter region 3, p-type base region 4 and n-type collector region 5. Each of the emitter, base and collector regions 3, 4 and 5 extends vertically from the top surface to the bottom surface of the thin film 2. Each of the emitter and base regions 3 and 4 has a side boundary (or contour) extending substantially vertically from the top surface of the thin film 2. The p-type base region 4 is made narrow. In this embodiment, a base width W of the p-type base region 4 is approximately 0.5 micrometer (μm). The base width is defined substantially in a lateral direction parallel to the top surface of the thin film 2 by the vertically extending side boundaries of the emitter and base regions 3 and 4. The collector region 5 of this device has a low impurity concentration collector inner subregion 5a and a high impurity concentration collector outer subregion 5b. The low concentration collector subregion 5a adjoins and surrounds the p-type base region 4. The impurity concentration of the low concentration subregion 5a is lower than that of the p-type base region 4. The low concentration subregion 5a is surrounded by the high concentration subregion 5b whose impurity concentration is higher than that of the low concentration subregion 5a. The low concentration inner subregion 5a is contiguous to the base region 4 and forms a collector-base junction with the base region 4.

The device of this embodiment further has a silicon oxide film 6, an emitter electrode 7, a base electrode 8 and a collector electrode 9. Each of the electrodes 7, 8 and 9 is made of an Al film.

In this way, a npn bipolar transistor of a planar structure is formed in and on a single semiconductor thin film.

FIGS. 3A(T)–3E(S) show one example of a process for fabricating the thin film semiconductor device shown in FIGS. 1 and 2.

At a first step shown in a top view of FIG. 3A(T) and a side view of FIG. 3A(S), the polycrystalline silicon film 2 of a predetermined thickness is deposited by LPCVD on the insulating substrate 1, and patterning is performed by photoetching to obtain the desired shape of the film 2. Then, the polycrystalline silicon film 2 is made into a lightly doped n-type semiconductor by doping the polycrystalline silicon film 2 with n-type impurities such as phosphorus, or arsenic in an controlled amount, and annealing the doped film 2. For example, the impurity concentration of the lightly doped n-type polycrystalline silicon film 2 is about $10^{15}$ cm$^{-3}$.

At a second step shown in FIGS. 3B(T) and 3B(S), a silicon oxide film 11 is formed on the polycrystalline silicon film 2 by thermal oxidation of the polycrystalline silicon film 2 or CVD. Then, a base diffusion window 11a is opened at a predetermined position in the silicon oxide film 11 by photoetching. Then, a p-type region 4a is formed by ion implantation through the base diffusion window 11a and subsequent annealing. In this ion implantation, p-type impurities such as boron are added in an controlled amount through the base diffusion window 11a into the polycrystalline silicon film 2 by using the silicon oxide film 11 as a mask.

At a third step shown in FIGS. 3C(T) and 3C(S), a collector diffusion window 11b is formed in the silicon oxide film 11 by photoetching, and a photoresist film 12 to coat a base contact area is formed by photolithography in a part of the base diffusion window 11a. By using this photoresist film 12 and the silicon oxide film 11 as a mask, n-type impurity atoms 13 such as phosphorus or arsenic atoms are introduced through the base diffusion window 11a and collector diffusion window 11b by ion implantation.

At a step shown in FIGS. 3D(T) and 3D(S), the photoresist film 12 is removed, and then a silicon oxide film 14 is deposited on the entire surface by CVD. Then, the n+ emitter region 3 and the highly doped collector region 5b are formed by annealing to activate the n-type impurity atoms 13.

In this way, the p-type base region 4 of the base width W is formed by introducing and diffusing p-type impurities and n-type impurities successively by using the silicon oxide film 11 and the base diffusion window 11a, respectively, as the mask and the selective diffusion window which are common to the base region 4 and the emitter region 3. Each of the p type base diffusion and the n-type emitter diffusion proceeds sideways from the diffusion window 11a as well as downward. Therefore, the lateral dimensions of the base and emitter regions are determined by these lateral diffusion effects. Therefore, the base width W of the base region 4 is determined by the difference between the lateral diffusion length of the p-type impurities and the lateral diffusion length of the n-type impurities from the common diffusion window 11a. By this fabricating process, it is possible to accurately control the narrow base width W of the p-type base region 4 at the level of 0.5 micrometer without need for an expensive equipment for electron beam exposure.

The p-type base region 4 is surrounded by the low impurity concentration collector region 5a made of the lightly doped n-type material which is produced by the first step of FIGS. 3A(T) and 3A(S), and which is still left unchanged.

Then, contact holes are opened by photoetching in the silicon oxide films 11 and 14 to expose contact areas of the emitter region 3, base region 4 and collector region 5. The silicon oxide film 6 shown in FIG. 2 corresponds to the silicon oxide films 11 and 14.

At a step shown in FIGS. 3E(T) ad 3E(S), the emitter electrode 7, base electrode 8 and collector electrode 9 are formed by vacuum deposition and patterning of Al films. Then, the thin film semiconductor device including a planar structure npn bipolar transistor is completed by forming a final protective film (not shown).

In the thus-constructed thin film semiconductor device, the p-type base region 4 and the n+ emitter region 3 are formed by using the same mask formed by the silicon oxide film 11 and the base diffusion window 11a, and the base width W is determined by the distance between the contour of the lateral diffusion of the p-type impurities and the contour of the lateral diffusion of the n-type impurities from the base diffusion window 11a. Therefore, it is possible to decrease the base width accurately and obtain the structure having the base width as small as 0.5 micrometer. Therefore, the present invention can provide a high performance thin film semiconductor device by a relatively simple and less costly fabrication process.

During the operation of the bipolar transistor in which the emitter-base junction is forward biased and the collector-base junction is reverse biased, the depletion layer produced at the collector-base junction extends into the n-type side formed by the low impurity concentration collector region 5a whose impurity concentration is lower than that of the p-type base region 4. Accordingly, this structure can reduce the possibility of punch-through between emitter and collector and increase the withstand voltage in spite of the narrow width of the p-type base region 4.

The n+ emitter region 3, p-type base region 4 and n-type collector region 5 are formed in the single polycrystalline silicon film 2 formed on the insulating substrate 1 which can be formed by applying an insulating film such as a silicon oxide film on a semiconductor substrate. Accordingly, it is easy to integrate the thin film device of this embodiment with bulk semiconductor devices formed in the semiconductor substrate into a compact integrated circuit.

The semiconductor thin film 2 of the present invention can be constituted by a microcrystalline silicon film or an amorphous silicon film or a single crystal silicon film instead of a polycrystalline silicon film. The thin film semiconductor device may be in the form of a pnp bipolar transistor instead of an npn bipolar transistor.

In the present invention, it is optional to modify the structure of FIG. 2 so that the p-type base region 4 does not reach the bottom of the film 2. In this case, the film 2 has an n-type bulk layer corresponding to the collector region 5a. The n bulk layer extending from the top to the bottom of the film 2. The p-type base region 4 extends into the n bulk layer from the top surface but does not reach the bottom of the bulk layer. The n+ region 5b also extends into the n bulk layer from the top surface without reaching the bottom of the bulk layer. The p region 4 is separated from the n+ region 5b by the n bulk layer. The n bulk layer extends under the bottoms of the p base region 4 and the n+ region 5b. The n+ emitter region 3 extends into the p base region 4 from the top surface, and is surrounded by the p base region 4.

What is claimed is:

1. A thin film semiconductor device comprising:
   a collector region of a first conductivity type formed by introducing first type impurities in a semiconductor thin film which is formed on an insulating substrate, and which has a bottom surface contiguous to said insulating substrate and a top surface remote from said insulating substrate, said collector region extending into said thin film from said top surface of said thin film,
   a base region of a second conductivity type formed in said collector region by introducing second type impurities only through a predetermined surface area of said top surface of said thin film, said base region extending into said collector region from said top surface, said base region being made of a semiconductor of said second conductivity type produced by doping a material of said collector region with said second type impurity concentration of said second type impurities in said base region is higher than a first type impurity concentration of said first type impurities in said base region, said base region having a side boundary extending substantially vertically from said top surface of said thin film,
   an emitter region of said first conductivity type formed in said thin film by introducing said first type impurities only through said predetermined surface area of said top surface in such a manner that a base width of said base region is determined by a difference between a distance of lateral diffusion of said second type impurities from said predetermined surface area and a distance of lateral diffusion of said first type impurities from said predetermined surface area, said emitter region extending into said base region from said top surface of said thin film, said emitter region being made of a semiconductor of said first conductivity type produced by doping the semiconductor of said base region with said first type impurities, so that said emitter region has a first type impurity concentration higher than that of said collector region, said emitter region having a side boundary which extends substantially vertically from said top surface of said thin film, said base width being defined substantially in a lateral direction parallel to said top surface of said thin film by said side boundaries of said base and emitter regions,
   wherein said emitter region extends from said top surface to said bottom surface of said thin film, and is surrounded by said base region, which is surrounded by said collector region.

2. A thin film device according to claim 1 wherein said collector region comprises an inner subregion which is contiguous to said base region so as to form a collector-base junction with said base region and which is lower in impurity concentration than said base region.

3. A thin film semiconductor device comprising:

a collector region of a first conductivity type formed by doping with first type impurities in a semiconductor thin film which is formed on an insulating substrate and which has a bottom surface contiguous to said insulating substrate and a top surface remote from said insulating substrate, a base region of a second conductivity type extending into said collector region from said top surface to said bottom surface of said thin film and having a contour obtained by forming said base region by doping from said top surface of said thin film, said base region being made of a semiconductor of said second conductivity type produced by doping a material of said collector region with second type impurities, so that said base region is doped with said first and second impurities in such amounts that a second type impurity concentration of said second type impurities in said base region is higher than a first type impurity concentration of said first type impurities in said base region, and an emitter region of said first conductivity type extending into said base region from said top surface to said bottom surface of said thin film and having a contour obtained by forming said emitter region by doping from said top surface of said thin film, said emitter region being made of a semiconductor of said first conductivity type produced by doping the semiconductor of said base region with first type impurities, so that a first impurity concentration of said emitter region is higher than that of said collector region, each of said contours of said base and emitter regions extending substantially vertically from said top surface to said bottom surface of said thin film, a base width of said base region being defined substantially in a lateral direction parallel to said top surface of said thin film by said contours of said base and emitter regions, wherein said collector region comprises inner subregion which is lower in impurity concentration than said base region, and contiguous to said base region so as to form a collector-base junction with said base region, wherein said collector region further comprises an outer subregion which is higher in impurity concentration than said inner subregion, wherein said emitter region is surrounded by said base region, and said base region is surrounded by said collector region.

4. A thin film device according to claim 3 wherein said insulating substrate comprises a semiconductor substrate and an insulating film formed on said semiconductor substrate for separating said thin film from said semiconductor substrate.

5. A thin film device according to claim 3 wherein said base width of said base region between said collector and emitter regions is approximately 0.5 micrometer.

6. A thin film device according to claim 3 wherein said semiconductor thin film is a polycrystalline silicon film.

7. A thin film device according to claim 3 wherein said semiconductor thin film is a microcrystalline silicon film.

8. A thin film device according to claim 3 wherein said semiconductor thin film is an amorphous silicon film.

9. A thin film device according to claim 3 wherein said semiconductor thin film is a single crystal silicon film.

10. A semiconductor device as claimed in claim 1 wherein said semiconductor device comprises a lateral bipolar transistor and the only effective emitter to collector conduction path of said lateral transistor extends laterally across said base width in said direction parallel to said top surface.

11. A semiconductor device as claimed in claim 3 wherein said semiconductor device comprises a lateral bipolar transistor and the only effective emitter to collector conduction path of said lateral transistor extends laterally across said base width in said direction parallel to said top surface.

12. A thin film semiconductor device according to claim 1, wherein said second type impurity concentration of said base region is higher than said first type impurity concentration of said collector region.

13. A thin film semiconductor device according to claim 12, wherein a second type impurity concentration of said emitter region is higher than said first type impurity concentration of said collector region.

14. A thin film semiconductor device according to claim 13, wherein said collector region is doped only with said first type impurities.

15. A thin film semiconductor device according to claim 14, wherein said first type impurity concentration of said base region is substantially equal to that of said collector region.

16. A thin film semiconductor device according to claim 15, wherein said second type impurity concentration of said emitter region is approximately equal to said second type impurity concentration of said base region.

17. A thin film semiconductor device according to claim 14, wherein said second type impurity concentration of said base region is higher than said first type impurity concentration of said base region, and an excess of said second type impurity concentration of said base region over said first type impurity concentration of said base region is higher than said first type impurity concentration of said collector region.

18. A thin film semiconductor device according to claim 1, wherein said collector, base and emitter regions constitute a lateral npn bipolar transistor, so that said first type impurity concentration is a donor concentration of donor atoms and said second type impurity concentration is an acceptor concentration of acceptor atoms.

19. A thin film semiconductor device comprising:
a collector region of a first conductivity type formed in a semiconductor thin film which is formed on an insulating substrate, and which has a bottom surface contiguous to said insulating substrate and a top surface remote from said insulating substrate, said collector region extending into said thin film from said top surface of said thin film, said collector region being doped with first type impurity atoms to produce a semiconductor of said first conductivity type;
a base region of a second conductivity type formed in said collector region, and doped with both first type impurity atoms and second type impurity atoms so that a second type impurity concentration of said second type impurity atoms is higher than a first type impurity concentration of said first type impurity atoms; and an emitter region of said first conductivity type formed in said base region, and doped with both first and second type impurity atoms, said emitter region being shaped within said base region so as to define a base width substantially in a lateral direction parallel to said top surface of said thin film, said emitter region being surrounded by said base region and said base region is surrounded by said collector region, said first type impurity concentration of said first type impurity atoms of said emitter region being higher than that of said collector region.

20. A thin film semiconductor device according to claim 19, wherein said collector, base and emitter regions constitute a lateral npn bipolar transistor, and said emitter region is a heavily doped n+ type region whose donor concentration is higher than the donor concentration of said collector region.

21. A thin film device according to claim 19 wherein said collector region comprises inner subregion which is lower impurity concentration than said base region, and contiguous to said base region so as to form a collector-base junction with said base region.

22. A thin film device according to claim 21 wherein said collector region further comprises an outer subregion which is higher in impurity concentration than said inner subregion.

* * * * *